(12) United States Patent
Rabe

(10) Patent No.: US 9,213,059 B2
(45) Date of Patent: Dec. 15, 2015

(54) USING TEST ELEMENTS OF AN INTEGRATED CIRCUIT FOR INTEGRATED CIRCUIT TESTING

(71) Applicant: Honeywell International Inc., Morristown, NJ (US)

(72) Inventor: Robert Rabe, Chanhassen, MN (US)

(73) Assignee: Honeywell International Inc., Morris Plains, NJ (US)

( * ) Notice: Subject to any disclaimer, the term of this patent is extended or adjusted under 35 U.S.C. 154(b) by 184 days.

(21) Appl. No.: 13/783,847

(22) Filed: Mar. 4, 2013

(65) Prior Publication Data

US 2014/0247064 A1    Sep. 4, 2014

(51) Int. Cl.
*G01R 31/28* (2006.01)

(52) U.S. Cl.
CPC ........ *G01R 31/2843* (2013.01); *G01R 31/2879* (2013.01)

(58) Field of Classification Search
CPC .................................................. G01R 31/2884
See application file for complete search history.

(56) References Cited

U.S. PATENT DOCUMENTS

| | | |
|---|---|---|
| 6,185,706 B1 | 2/2001 | Sugasawara |
| 6,614,253 B2 | 9/2003 | Berkely |
| 8,097,474 B2 | 1/2012 | Anemikos et al. |
| 2007/0024314 A1* | 2/2007 | Teng et al. ..................... 324/765 |
| 2010/0013514 A1 | 1/2010 | Lee et al. |
| 2010/0207649 A1* | 8/2010 | Krishnan et al. .............. 324/754 |
| 2011/0320894 A1 | 12/2011 | Chun et al. |
| 2013/0120012 A1* | 5/2013 | Pagani ..................... 324/754.03 |
| 2013/0257445 A1* | 10/2013 | Schlarmann et al. ......... 324/452 |

FOREIGN PATENT DOCUMENTS

JP            6-160482         6/1994

OTHER PUBLICATIONS

Wang et al., "Enhanced Testing Performance Via Unbiased Test Sets", 9 pages, European Design and Test Conference, Mar. 6-9, 1995.
Rajsuman, "Iddq Testing for CMOS VLSI", Proceedings of the IEEE, vol. 88, No. 4, Apr. 2000, 23 pages.

* cited by examiner

*Primary Examiner* — Tung X Nguyen
*Assistant Examiner* — Feba Pothen
(74) *Attorney, Agent, or Firm* — Shumaker & Sieffert, P.A.

(57) ABSTRACT

In some examples, a system, such as an integrated circuit device (IC), includes functional elements interspersed with access elements and associated test elements. The access elements and associated test elements may be used to determine a health status of the IC or an area of the IC. A health status determination can include, for example, identification of an area of the IC where performance may have degraded (e.g., has degraded or is about to degrade beyond desirable levels of performance). For example, a test element can be configured to generate a parametric output in response to an electrical stimulus, where the parametric output indicates a health status of one or more functional elements of the IC.

17 Claims, 6 Drawing Sheets

USING TEST ELEMENTS OF AN INTEGRATED CIRCUIT FOR INTEGRATED CIRCUIT TESTING

TECHNICAL FIELD

The disclosure relates to integrated circuit devices.

BACKGROUND

In some applications, an integrated circuit device can include millions or sometimes billions of functional elements and associated electrical interconnections. Each functional element or a plurality of functional elements in combination can perform functions of the integrated circuit device. These functional elements and associated interconnections may be susceptible to a multitude of factors that can cause degradation in performance, integrity, and reliability of the overall device. Degradation of performance, integrity, and reliability can occur throughout the lifecycle of the device, such as during manufacturing, shipping, and operational use.

SUMMARY

The disclosure describes a system (e.g., an integrated circuit device (IC)) that includes functional elements interspersed with access elements and associated test elements, where the access elements and associated test elements may be used to determine a health status of the system or an area of the system. A health status determination can include, for example, identification of an area of an IC where performance may have degraded (e.g., has degraded or is about to degrade beyond desirable levels of performance). Applying an electrical stimulus to one or more access elements of the system can cause one or more associated test elements to generate a parametric response (also referred to herein as a "parametric output", for example, a voltage or current signal), which may indicate a status of a functional element proximate the one or more test elements. A controller may, for example, receive the parametric response, e.g., by measuring the parametric response at the one or more access elements where the electrical stimulus was applied, and determine whether performance degradation has occurred or is about to occur based on the parametric response. In some examples, the location of the one or more access elements where degradation is identified may help isolate a particular area of the system that likely contains functional elements and/or interconnections with similar performance degradation. The disclosure also describes systems including the IC and methods of using and making the IC.

In one example, the disclosure is directed to a system comprising an integrated circuit device. The integrated circuit device includes a plurality of functional elements arranged to span an area of the integrated circuit device. The integrated circuit device further includes a plurality of test elements interspersed with the plurality of functional elements. The integrated circuit device further includes a plurality of access elements, each access element of the plurality of access elements being electrically coupled to at least one test element of the plurality of test elements. Each access element of the plurality of access elements is configured to relay an electrical stimulus to the at least one test element. The at least one test element of the plurality of test elements is configured to generate a parametric output in response to the electrical stimulus.

In another example, the disclosure is directed to a method comprising applying an electrical stimulus to at least one access element of an area of an integrated circuit device. The at least one access element is interspersed with a plurality of functional elements and is electrically coupled to at least one test element. The method further comprises determining a parametric output generated by the at least one test element in response to the electrical stimulus.

In another example, the disclosure is directed to a system comprising an integrated circuit device. The integrated circuit device comprises a plurality of means for providing a function to the integrated circuit. The means for providing the function are arranged to span an area of the integrated circuit device. The integrated circuit device further comprises a plurality of means for testing interspersed with the plurality of means for providing the function. The integrated circuit device further comprises a plurality of means for accessing the means for testing, each means for accessing of the plurality of means for accessing being electrically coupled to at least one means for testing of the plurality of means for testing. Each means for accessing is configured to relay an electrical stimulus to the at least one means for testing. The at least one means for testing of the plurality of means for testing is configured to generate a parametric output in response to the electrical stimulus.

In another aspect, the disclosure is directed to a computer-readable storage medium, which may be an article of manufacture. The computer-readable storage medium includes computer-readable instructions for execution by a controller (e.g., a processor). The instructions cause a programmable controller to perform any part of the techniques described herein. The instructions may be, for example, software instructions, such as those used to define a software or computer program. The software or computer program may be, for example, modified or otherwise updated base on a specific patient's requirements. The computer-readable medium may be a computer-readable storage medium such as a storage device (e.g., a disk drive, or an optical drive), memory (e.g., a Flash memory, read only memory (ROM), or random access memory (RAM)) or any other type of volatile or non-volatile memory that stores instructions (e.g., in the form of a computer program or other executable) to cause a programmable processor to perform the techniques described herein. In some examples, the computer-readable storage medium is non-transitory.

The details of one or more examples are set forth in the accompanying drawings and the description below. Other features, objects, and advantages of the disclosure will be apparent from the description and drawings, and from the claims.

DETAILED DESCRIPTION

Figure 1:
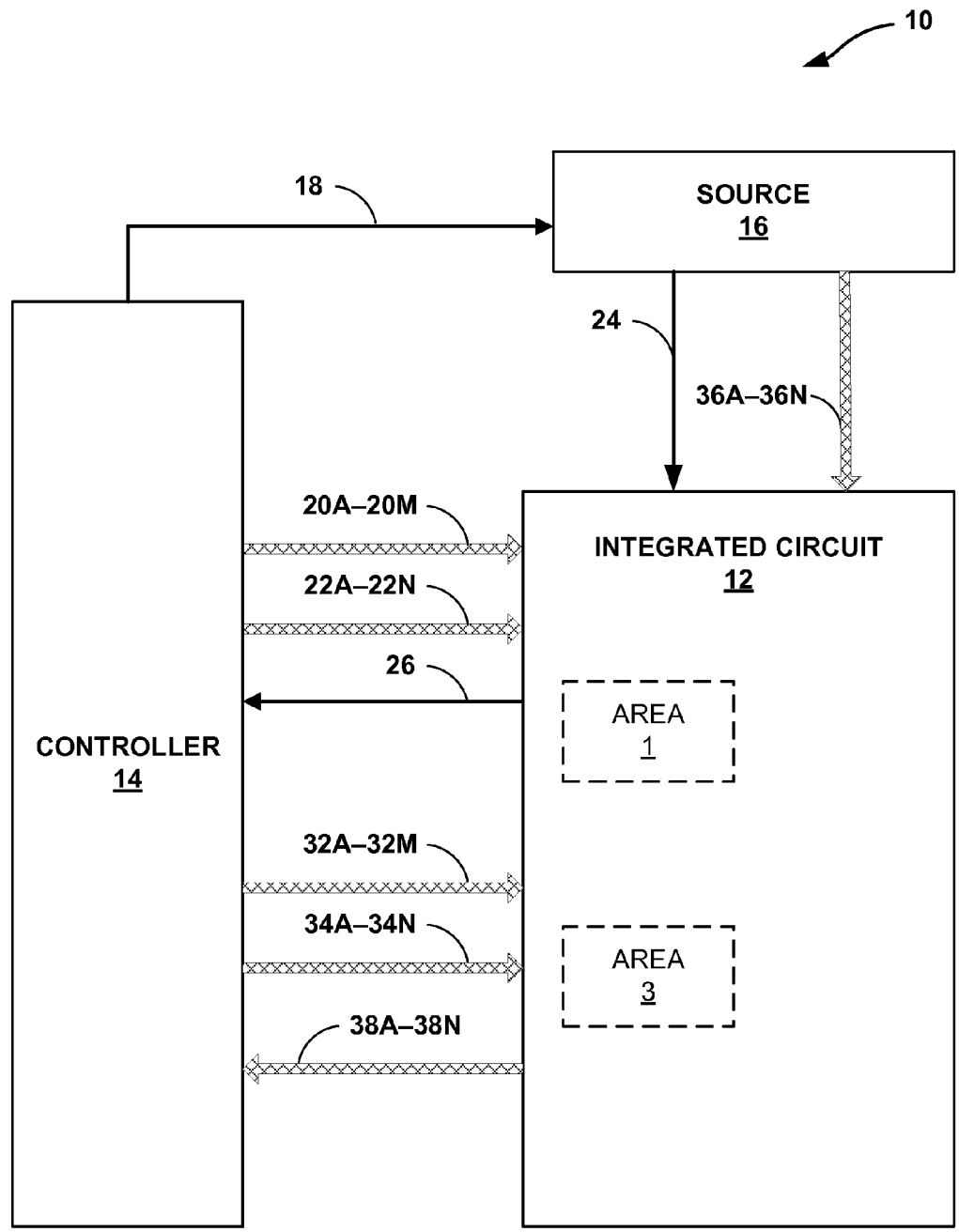
FIG. 1 is a block diagram illustrating an example system for testing performance of an integrated circuit device, in accordance with one or more aspects of the present disclosure.

An integrated circuit (IC) (also referred to herein in some examples as an IC device) can include millions or sometimes billions of functional elements and associated electrical interconnections that each or in combination perform functions of the device. The integrity and reliability of the IC may depend on the predictable behavior of the underlying elements (e.g., electrical elements) used in the design and construction of the IC. Error or degradation (e.g., resulting in failure) of one or more functional elements (e.g., a single functional element or a plurality of functional elements) or interconnections of an IC can render the entire device or larger system of which the IC is part inoperable. Detecting degradation of one or more functional elements of an IC prior to failure of the IC can be useful and valuable, such as when the IC is used in an application or system that requires relatively high reliability and/or security.

Testing an individual IC such as this or another relatively complicated system, e.g., testing a functional element of the IC for degradation in performance, integrity, or reliability, may be relatively difficult in some cases. For example, due to the large number of elements in an IC, it may be relatively difficult to test each element of the IC, either during manufacture or in the field. As another example, if the IC has been installed in a larger system of devices or is being used in an application in the field, access to the device or its functional elements may be relatively limited (e.g., during operation). Furthermore, without individually testing each functional element and/or interconnection of the IC, difficulty may arise in isolating the degradation to a particular area of functional elements and/or interconnections of the IC.

In some examples described herein, a system includes a plurality of functional elements (FE) interspersed with a plurality of access elements (AE) and associated "surrogate" test elements (TE), where the access elements and test elements are configured to be used by a controller or the like to test the performance of the system or otherwise determine a health status of the system. While an IC including a plurality of FE interspersed with a plurality of AE and associated "surrogate" TE are primarily described herein, in other examples, another system may include the FE, TE, and AE described herein. Determination of a health status of an IC (or another system) can include, for example, detection of a failure or detection of degraded performance of one or more FE prior to failure of the FE or the IC. The controller may, for example, identify areas of the IC where performance may have degraded or may be about to degrade beyond a desirable level of performance based on a parametric output of one or more test elements.

The output generated by a particular TE may, for example, be indicative of the characteristics of the TE, which, in turn, may indicate the health status of one or more functional elements that are co-located with the TE on the IC (e.g., proximate to the IC, such as adjacent to the TE or within a predetermined radius of the TE). Each TE that is co-located with a FE (e.g., within the same area of an IC) may exhibit similar electrical, physical, and behavioral properties as the FE. Over time, the TE may experience similar performance degradation as the FE. In some cases, directly testing the FE for performance degradation can cause damage to the FE and may interfere with an operation of the FE. To help minimize the risk of damaging or interfering with an FE through a direct test, a TE located near the FE can be tested to determine whether the nearby FE is, or is about to, exhibit degraded performance. In some examples, one or more TE can be tested at the time of manufacturing to verify proper operation of an IC. Testing of the TE can be included in the evaluation of the IC and used to confirm correct operation of the IC without directly testing, and possibly damaging, FE. In addition, one or more TE can be tested during operational use (e.g., after installing the IC in a larger system or component) to identify impending or actual performance degradation or to confirm no unexpected change in the operation of the IC has occurred. In this way, a TE may be used as a surrogate FE to test the performance of the IC throughout the manufacturing and operational lifecycle of the IC.

An AE is electrically connected to at least one respective TE and provides an access point for interacting with (e.g., delivering a stimulus to or receiving an output from) the at least one respective TE. In some examples, a controller is configured to control a stimulus source to apply a known electrical stimulus to one or more access elements in a particular area of the IC. The stimulus may be configured to cause one or more test elements associated with and electrically connected to the one or more access elements to generate a parametric response (also referred to herein as a "parametric output", for example, a voltage or current signal). The controller may determine, based on the measured parametric response of the one or more test elements, whether performance degradation of one or more functional elements may have occurred or is about to occur at or near the area of the IC where the one or more access elements are located. A controller may isolate a particular area of the IC that may contain functional elements and/or interconnections with performance degradation based on the location of the one or more test elements where degradation is identified (via one or more access elements and associated test elements). In this way, a TE may be a surrogate FE that may indicate whether an actual FE of the IC located proximate the TE may be exhibiting degraded performance.

In some examples, the access elements and the test elements of an IC may not perform any function for the IC, other than being used to test the performance of one or more functional elements of the IC. In other examples, in addition to testing the performance of one or more functional elements of the IC, the access elements and the test elements of an IC may be configured to perform functions for the IC. That is, similar to the functional elements of an IC, the access elements and/or test elements may be used to perform functions for the IC other than to test the performance of the IC.

In addition, in some examples, the FE of an IC are functionally isolated from some or all of the AE and TE. In these examples, the FE may perform a plurality of functions of the IC, and although the FE, AE, and TE may share some common interconnections (e.g., to a ground or power source), the FE may not share interconnections with either the AE or TE that are used in performing the plurality of functions of the IC. Functionally isolating the FE from both the AE and TE may allow the TE to be stimulated and the parametric responses of the TE to be measured without interfering with the plurality of functions of the IC. This may allow for ongoing health monitoring (e.g., performance monitoring), as well as health status checking (e.g., performance testing) of the IC at any time during the lifecycle of the IC.

In addition, the functional isolation of the AE and TE from the FE may provide information useful for identifying a point in time when performance degradation may have started, which may help determine a cause of the performance degradation. For example, detection of degradation prior to shipping may indicate the source of the degradation is a particular step in the manufacturing process that precedes shipping. As another example, if the degradation is detected just prior to operational use, the source of the degradation could more likely be a point in the shipping, storage, or installation process.

In other systems, external test instruments (e.g., instruments that are external to the IC, separate from the IC, or otherwise outside the boundary of an IC die) are used to test performance of an IC. While external test instruments may be useful to test performance of an IC during the manufacturing process, using external test instruments to test the performance of an IC may not be useful and/or feasible in the field and/or during operational use, without interfering with the functionality of the device. In other words, external test instruments may make it relatively difficult to test the performance of an IC periodically throughout the life cycle of the IC, or to identify when in the life cycle performance degradation may have started. Thus, the external test instruments may not provide some of the benefits provided by the AE, TE, and FE described herein.

In other examples, at least some or all the FE of an IC are not functionally isolated from the AE and TE, such that at least some or all of the TE are configured to also function as a FE (e.g., to perform functions of the IC). In these examples, one or more TE (and AE) may be indistinguishable from the FE, and multi-purpose elements, rather than being dedicated to determining the health status of IC.

In some examples, the FE, AE, and associated TE of the IC are arranged in a grid formation, and a particular AE or group of AE may be selected for testing. Arranging the elements in a grid formation (as opposed to a random or non-uniform arrangement) may provide the IC with a capability to perform localized tests of particular areas of the IC or perform tests associated with specific functions of the IC. For example, a localized test may not only provide insight into the performance of a particular area of the IC, but may also provide knowledge about the performance of FE within the particular area that perform a specific function for the IC. The grid formation is only one example arrangement and other arrangements are possible. For example, AE and TE may be otherwise systematically placed or randomly positioned in a region of the IC where test and evaluation means are desired.

In some examples, the FE, AE, and associated TE are interconnected via a daisy chain arrangement. Similar to the grid formation, the daisy chain (sometimes referred to herein as a scan-chain) arrangement may provide a capability to conduct localized tests of not just FE, but also interconnections between the FE within particular areas of the IC.

In some examples, a controller contained in the system (e.g., a component) in which the IC embedded or external to the system of which the IC is part may test the performance of the IC using the access elements, test elements, and any associated connections, switches, stimulus sources. In some examples, the IC includes a parametric tester (e.g., one or more controllers) built-in to the packaging of the IC or the IC itself. These parametric testers may be configured to determine the health status of an IC, e.g., based on parametric output of one or more TE of the IC. The performance health status (also referred to as "health status") determination may also be referred to as conducting tests (e.g., built-in-tests (BIT)) of multiple AE and associated TE. Without manual intervention, the parametric tester of the IC may periodically perform a BIT, and the parametric tester may automatically determine and report performance health of the IC. In some examples, the parametric tester is dedicated to determining the performance health status of an IC, e.g., based on parametric output of one or more TE of the IC. In another example, the parametric tester provides another function in addition to testing the determining the performance health status of an IC, e.g., based on parametric output of one or more TE of the IC.

FIG. 1 is a block diagram illustrating example system 10 for testing performance of integrated circuit device 12, in accordance with one or more aspects of the present disclosure. In the example of FIG. 1, system 10 includes integrated circuit (IC) device 12, controller 14, and source 16. For ease of description, system 10 illustrates controller 14, source 16, and IC 12 as separate and distinct components. In other examples, two or more of IC 12, controller 14, and source 16 can be functionally integrated. For example, two or more of IC 12, controller 14, and source 16 may be provided by the same hardware. System 10 could be part of a single electrical component or part of a larger system having more electrical components than those illustrated by FIG. 1. In addition, in some examples, controller 14 and source 16 are a part of a parametric tester of system 10. In some examples, system 10 represents all or part of a mechanical system, a micro electrical-mechanical system (MEMS), an optical system, a biological system, an acoustic system, or any other system where the need to test performance of a functional element or area of functional elements of an IC (or other system) is desired.

Controller 14 can comprise any suitable arrangement of hardware, software, firmware, or any combination thereof, to perform the techniques attributed to controller 14 herein, such as, but not limited to, implementing a performance test of IC 12. For example, controller 14 may include any one or more microprocessors, digital signal processors (DSPs), application specific integrated circuits (ASICs), field programmable gate arrays (FPGAs), or any other equivalent integrated or discrete logic circuitry, as well as any combinations of such components. When controller 14 includes software or firmware, controller 14 further includes any necessary hardware for storing and executing the software or firmware, such as one or more processors or processing units. In general, a processing unit may include one or more microprocessors, DSPs, ASICs, FPGAs, or any other equivalent integrated or discrete logic circuitry, as well as any combinations of such components.

Although not shown in FIG. 1, system 10 may include a memory configured to store data. The memory may include any volatile or non-volatile media, such as a random access memory (RAM), read only memory (ROM), non-volatile RAM (NVRAM), electrically erasable programmable ROM (EEPROM), flash memory, and the like. In some examples, the memory may be external to IC 12, e.g., may be external to a package in which IC is housed.

Source 16 is configured to generate and output a stimulus. In the example shown in FIG. 1, source 16 is configured to generate and output an electrical stimulus, e.g., a current or voltage signal. In the example of FIG. 1, source 16 includes logic for receiving an enable command from a controller, such as controller 14, which causes source 16 to generate, relay, or otherwise output an electrical stimulus to a select access element of IC, which may be used to test performance of IC 12. Examples of source 16 may include a battery source with control logic, a signal generator, or any other power source that can be controlled by controller 14 to output an electrical stimulus. Although system 10 is primarily described herein as using electrical connections, electrical stimuli, and other electrical systems, these descriptions should in no way be construed as limiting. For example, in other examples, system 10 may be configured to test the health status of IC 12 using a different type of stimulus; in other examples, source 16 may be configured to generate a magnetic stimulus, a mechanical stimulus, an optical stimulus, a biological stimulus, an acoustic stimulus, or another type of stimulus or combination of stimuli.

IC 12 is any suitable IC device, either standalone, or embedded in an electrical component, that may include multiple semiconductor devices and electrical interconnections that are arranged logically and configured to perform a plurality of electrical functions. Examples of IC 12 include microprocessors, memories, and the like. In the example shown in FIG. 1, IC 12 includes area 1 and area 3, which may represent separate physical and/or logical portions of IC 12. For example, semiconductor devices and interconnections within area 1 may perform a plurality of functions of IC 12 that are distinct from a plurality of functions performed by semiconductor devices and interconnections within area 3.

Controller 14 is electrically coupled to source 16 and IC 12. In system 10 of FIG. 1, communication channel 18 electrically couples controller 14 to source 16. Communication channel 18 is used by controller 14 to enable and command source 16 to output an electrical stimulus. In addition, in the example shown in FIG. 1, source 16 and IC 12 are electrically connected via stimulus line 24, by which an electrical stimulus outputted from source 16 is received by IC 12. Enable lines 20A-20N (collectively "enable lines 20"), enable lines 22A-22M (collectively "enable lines 22"), and response line 26 electrically couple IC 12 to controller 14, and are used by controller 14 to perform performance testing of area 1 of IC 12. Stimulus line 24 and response line 26 may be bi-directional and/or multi-purpose in some examples.

In some examples, system 10 also includes enable lines 32A-32N (collectively "enable lines 32"), enable lines 34A-34M (collectively "enable lines 34"), stimulus lines 36A-36N (collectively "stimulus lines 36), response lines 38A-38N (collectively response lines 38). Enable lines 32, enable lines 34, and response lines 38 electrically connect IC 12 to controller 14, and may be used by controller 14 to perform performance testing of area 3 of IC 12. Stimulus lines 36 electrically connect source 16 and IC 12. Multiple electrical stimuli outputted from source 16 may be received by IC 12 via stimulus lines 36.

Figure 2:
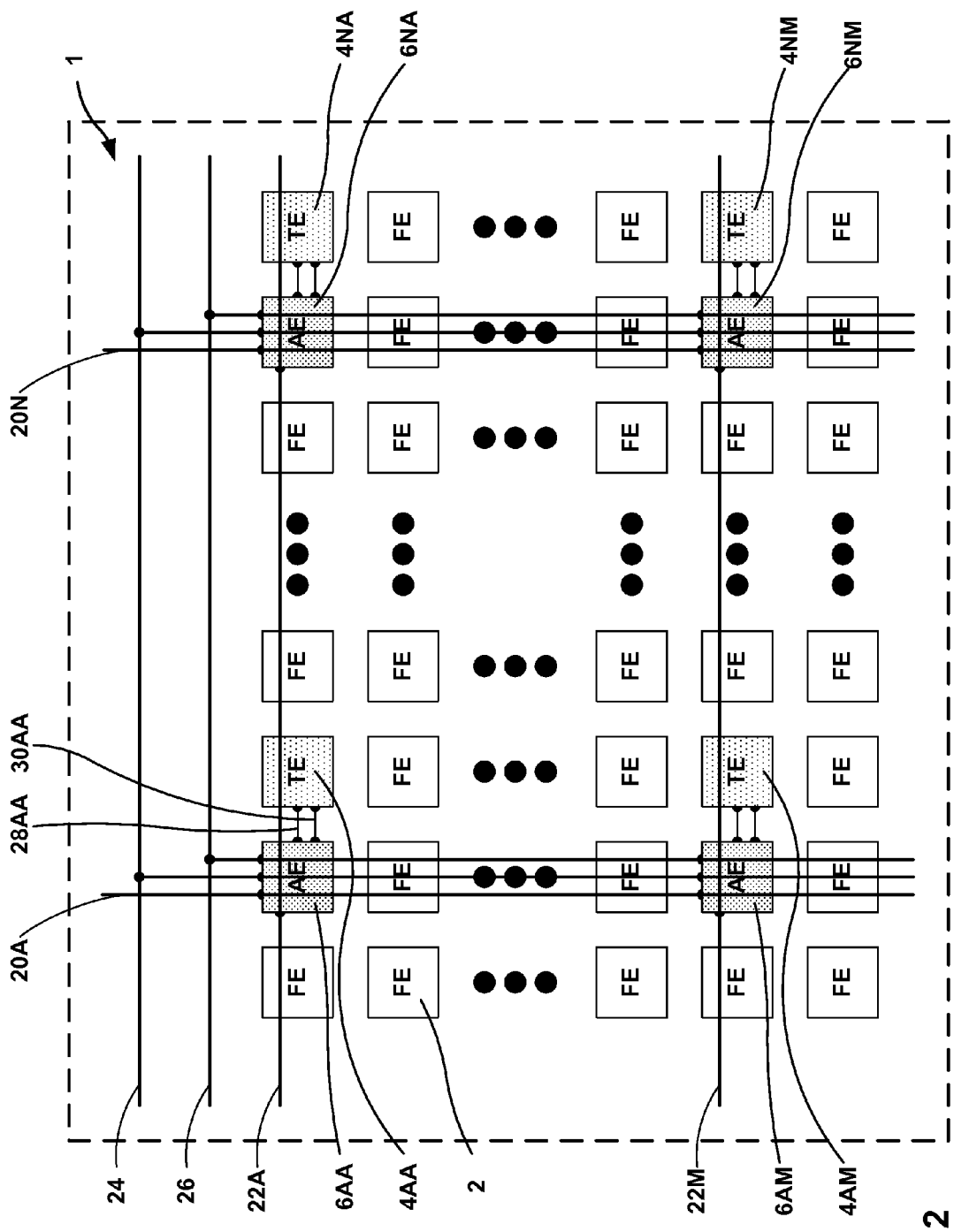
FIG. 2 is a block diagram illustrating an example area of an example integrated circuit device configured to test performance of the area of the integrated circuit device, in accordance with one or more aspects of the present disclosure.

System 10 is described in further detail with respect to FIG. 2, which is a block diagram illustrating example area 1 of example IC 12. Area 1 represents any logical or physical portion of IC 12. In the example shown in FIG. 2, area 1 includes a plurality of functional elements 2 (collectively "FE 2") that are configured to perform a function IC individually or in or in combination with at least one other FE 2. For example, area 1 may represent one or more memory cells of a computer memory chip. In some examples, each one of FE 2 may represent the logical devices (e.g., transistors, gates, switches, and the like) that perform the functional operations (e.g., data store, data access, data write) of these one or more memory cells.

Controller 14 is configured to test performance of area 1 of the IC via one or more test elements (TE) of a plurality of test elements (TE) 4AA-4NM (collectively "TE 4"), and one or more access elements of a plurality of access elements (AE) 6AA-6NM (collectively "AE 6"). TE 4 are configured to generate a parametric output (e.g., an analog waveform, voltage, current, and the like) in response to an applied stimulus. In some examples, TE 4 are each configured to generate a respective parametric output, while in other examples, two or more TE 4 are configured to work together to generate a common parametric output. As discussed in further detail below, the parametric output is indicative of the performance health status of the one or more TE 4 that generated the parametric output. For example, controller 14 may determine, based on a parametric output generated by a particular TE 4, that the performance of TE 4 is acceptable, unacceptable, or has degraded, such that intervention is advisable. In some examples, controller 14 stores the one or more parametric outputs generated by TE 4 in a memory. The stored parametric outputs can be, for example, a raw electrical signal generated by the TE 4 and provided to controller 14 via an AE 6, a parameterized signal, or one or more characteristics of the parametric output, such as, but not limited to, an amplitude, a frequency, and a phase shift of a sinusoidal parametric response.

Some examples of TE 4 include transistor devices. Some examples of AE 6 include analog switches or transmissions gates. Each one of TE 4 can be similar or distinct from each other one of TE 4, and each one of AE 6 can be similar or distinct from each other one of AE 6. TE 4 and AE 6 are not limited to transistors, analog switches, and transmission gates. For example, TE 4 and AE 6 may represent any device of an IC that can function as a stimulus and response net (e.g., an electrical node of a circuit configured to receive an electrical stimulus and in response, generate an electrical response). In addition, in some examples, TE 4 and AE 6 may include internal or external state machines to perform control and evaluation operations of TE 4 and AE 6. Thus, TE 4 and AE 6 may range from relatively simple devices, such as transistors, analog switches, and transmission gates, to more complex devices.

In the example shown in FIG. 2, area 1 also includes a plurality of enable lines 20 and a plurality of enable lines 22. Enable lines 20, 22 may each be, for example, any one or more of electrical traces, electrically conductive channels, electrically conductive wires, and the like. Enable lines 20, 22 are electrically connected to at least one AE 6, and may be configured to transmit electrical signals to one or more AE 6 electrically connected to the particular enable lines 20, 22. Controller 14 may cause source 16 to transmit electrical signals to "select" or "enable" the one or more AE 6. For example, controller 14 can electrically enable AE 6AM by controlling source 16 to assert or apply a voltage to both enable lines 20A and 22M.

In the example shown in FIG. 2, area 1 also includes stimulus line 24 and response line 26. Controller 14 is configured to apply an electrical stimulus (e.g., voltage or current signal) to stimulus line 24, e.g., via source 16; the electrical stimulus applied to stimulus line 24 may be received by one or more AE 6. For example, controller 14 may be configured to control source 16 and command an electrical stimulus output from source 16 at stimulus line 24. Stimulus line 24 electrically connects IC 12 to source 16 such that the stimulus output from source 16 is received by IC 12 at one or more AE 6. One or more TE 6 electrically connected to the one or more AE 6 that received the stimulus generated by source 6 may generate a response to the stimulus. The one or more TE 6 may be configured to generate a parametric output (e.g., an analog waveform, voltage, current, and the like), which may then be transmitted to response line 26 via the one or more associated AE 6. For example, controller 14 may be configured to measure the output applied at response line 26 from the one or more AE 6. In some examples, area 1 may include multiple stimulus lines 24 and response lines 26, which may enable substantially simultaneous application of different stimulus signals to particular AE 6 and substantially simultaneous receipt by controller 14 of different response signals from particular AE 6.

In the example shown in FIG. 2, the placement of FE 2 within area 1 of IC 12 corresponds to an N by M grid formation (or fabric or arrangement) of elements with multiple FE 2 interspersed with TE 4 and AE 6. AE 6AA and TE 4AA represent an access element and associated test element pair in row A, column A of the grid; AE 6NM and TE 4NM represent an access element and associated test element pair in row N, column M of the grid, and the like. The grid formation of elements represents only one example placement of FE 2, TE 4, and AE 6. In some examples, the formation of elements may be formed to include AE 6 interspersed with TE 4. In some examples, the formation of elements may include FE 2 uniformly interspersed with TE 4. In some examples, the formation of elements may include FE 2 uniformly interspersed with AE 6. In some examples, the formation of elements may include FE 2, TE 4, and AE 6 arranged in a uniform formation, a non-uniform formation, a random formation, or any other formation of elements of an IC. In some examples, the relative arrangement of FE 2, TE 4, and AE 6 of area 1 may be selected such that the performance of each FE 2 of area 1 is indicated by the output generated by at least one TE 4 in area 1, such that controller 14 may test the performance of each FE 2 of area 1 via at least one TE 4 and corresponding AE 6 of area 1. The performance of a particular FE 2 of area 1 may be indicated by the output generated by at least one TE 4 in relatively close proximity to FE 2 (e.g., directly adjacent to or within a predetermined radius of FE 2). The close proximity may cause any performance degradation factors affecting FE 2 to also affect TE 4.

In a uniform formation of elements, the number of TE 4 and AE 6 of area 1 may be approximately proportionate to the number of FE 2 of area 1, and the TE 4 and AE 6 of area 1 may further be interspersed approximately evenly (e.g., evenly or nearly evenly) within the arrangement of FE 2 of area 1. This arrangement of elements may allow controller 14 to test all portions of area 1.

In a non-uniform formation of elements, the TE 4 and AE 6 of area 1 may be arranged unevenly within the arrangement of FE 2 of area 1. For example, the TE 4 and AE 6 may be interspersed within some groups of FE 2 but not interspersed within other groups of FE 2, such that the number of TE 4 and AE 6 in one or more portions of area 1 outnumbers the TE 4 and AE 6 in other portions of area 1. This arrangement of elements may allow controller 14 to test certain portions of area 1 more so than other portions of area 1.

In a random (or pseudo-random) formation of elements, the number of TE 4 and AE 6 of area 1 may or may not be approximately proportionate to the number of FE 2 of area 1, and the TE 4 and AE 6 may be interspersed within the arrangement of FE 2 in no particular pattern or logical order. This arrangement of elements may allow controller 14 to test a statistically significant number of portions of area 1 and may promote concealment of the TE 4 and AE 6 within the FE 2 (when IC 12 is installed in a security system).

In some examples, at least some FE 2, TE 4, and AE 6 are arranged in a daisy chain formation (otherwise known as a scan-chain formation). A daisy chain formation may include multiple elements electrically interconnected in series via a plurality of test interconnections, which may define a scan path. Configuring at least some FE 2, TE 4, and AE 6 in a daisy chain formation may enable controller 14 to substantially simultaneously (e.g., simultaneously or nearly simultaneously) test electrical interconnections between multiple elements (e.g., FE 2, TE 4, and AE 6) of IC 12. For example, controller 14 may control source 16 to apply a stimulus at the first AE 6 in a daisy chain series; the stimulus may traverse through each element in the series along the scan path. Controller 14 may determine a response of the one or more test elements in the daisy chain to the stimulus at each AE 6 within the chain. Controller 14 may determine a difference between the measured response of a particular TE 4 (measured at an associated AE 6) and an expected response at one or more AE 6, and the difference may indicate the health status of the interconnections within elements (e.g., FE 2) of IC 12 proximate the one or more AE 6. In this way, in some examples, controller 14 can use the FE 2, TE 4, and AE 6 arranged in a daisy chain formation to detect the performance degradation of the interconnections within IC 12 near the one or more AE 6. An example use of a daisy chain formation is described in more detail with respect to FIG. 4.

For simplicity, FIG. 2 illustrates only four pairs of TE 4 and associated AE 6. However, area 1 may include any suitable number of pairs of AE 6 and TE for testing and measuring performance of area 1. The number of pairs of AE 6 and TE 4 may depend on the complexity of IC 12. For example, verifying proper operation of multiple, relatively complex FE 2 may require a proportionately significant number of AE 6 and TE 4. Even if no two AE 6, TE 4, or FE 2 are fabricated to be physically identical, the electrical behavior of each AE 6, TE 4, and FE 2 can be bounded sufficiently to allow a relatively high probability of functioning properly when installed in IC 12. Accordingly, in order for controller 14 to determine whether performance degradation of IC 12 has or is about to occur, IC 12 may include a statistically significant number of TE 4 to generate parametric responses to a stimulus (on which controller 14 determines whether performance degradation of IC 12 has or is about to occur) and associated AE 6 (with which controller 14 may measure the parametric responses of the associated TE 4). A relatively large number of AE 6 and TE 4 may provide a sufficient number of parametric responses, even though the total number of FE 2 within IC 12 may generally far exceed the total number of AE 6 and TE 4.

IC 12 may include any suitable ratio of the number of TE 4 and AE 6 pairs to the number of FE 2. In some examples, area 1 includes one pair of AE 6 and TE 4 for each of the FE 2, which may result in a relatively high confidence in a health status determination made by controller 14 from a performance test of area 1. In other examples, area 1 includes one pair of AE 6 and TE 4 for two or more FE 2 (e.g., every hundred or thousand FE 2), which may result in a lesser confidence in a health status determination made by controller 14 from a performance test of area 1.

In addition, while FIG. 2 illustrates multiple pairs of AE 6 and TE 4, in other examples, each AE 6 may share an electrical interconnection with two or more TE 4. For instance, FIG. 2 illustrates that AE 6AA and TE 4AA share electrical interconnections 28AA and 30AA. In some examples however, to minimize a quantity of AE 6 without minimizing a quantity of TE 4, AE 6AA may be electrically coupled to TE 4AM, TE 4NA, and TE 4NM. While an example including "pairs" of AE and TE are described, in other examples, any suitable ratio of quantity of TE and quantity of AE may be used. For instance, three or four TE may share a connection with a single AE and, in other examples, one hundred TE may share a connection with a single AE.

In the example shown in FIG. 2, TE 4 and AE 6 are all functionally isolated from each of the FE 2. In other words, none of the TE 4 or the AE 6 are electrically coupled to a functional input or output of each of the FE 2. While in some examples, TE 4, AE 6, and FE 2 may share a common electrical bus for supply voltage, supply current, and/or common grounds, in the example shown in FIG. 2, each of TE 4 and AE 6 are functionally isolated from FE 2, such that area 1 is configured such that TE 4 and AE 4 do not effect functional operations performed by FE 2.

To maintain a relatively high level of integrity and reliability, electronic components and systems may rely on predictable behavior of IC 12 and FE 2 within the design of IC 12. In some examples, one IC 12 within a component or system may contain millions or billions of individual underlying FE. Defective manufacturing, malicious tapering, or performance degradation of one or more of these FE can cause the entire IC 12, and consequently the associated electrical component or and system, to operate incorrectly or in some cases, fail.

In some cases, e.g., due to the relatively complex nature of the electrical component or system of which IC 12 is a part (also referred to herein as the "parent" electrical component or system), a thorough test of an individual IC 12 within the parent component or system, either during manufacture or in the field, may be impractical or nearly impossible. Without periodic testing during the lifecycle of IC 12, IC 12, the parent component or system, or both, may appear to function at acceptable performance levels at an external interface but may not function at acceptable performance levels internally, or the performance levels may be approaching unacceptable levels. Not functioning at acceptable performance levels or approaching unacceptable performance levels could lead to premature failure or otherwise unexpected failure of IC 12 or parent component or system. Additionally, if unintended, deliberate, and/or latent manufacturing defects and/or external factors cause IC 12 to have an unexpected change in properties during use, the parent component or system in which IC 12 is installed may prematurely fail, even though IC 12 appears to be functionally operable upon initial test and use (e.g., the first test after manufacturing of IC 12 is complete and prior to installation into a parent component or system). Unexpected change of IC performance can be a concern in applications (e.g., defense, security, or finance) in which IC 12 may be subjected to tampering (e.g., by hacking) by adversaries.

In the example of FIG. 2, IC 12 includes a plurality of FE 2 arranged to span area 1 of IC 12. Each FE 2 (alone or in combination) may perform a function of the IC. IC 12 may further include a plurality of TE 4 interspersed with the plurality of FE 2. For instance, FIG. 2 shows TE 4 interspersed with FE 2 in an N by M grid formation of elements. In some examples, each TE of the plurality of TE 4 is functionally isolated from each FE of the plurality of FE 2. In some examples, TE 4 may share common power and/or ground supplies with FE 2, however, none of the TE 4 share a functional interconnection with any of the FE 2. As such each of TE 4 is functionally isolated from each of FE 2. In other examples, at least one TE 4 may share a functional interconnection with at least one FE 2.

In the example shown in FIG. 2, IC 12 includes a plurality of AE 6 interspersed with FE 2 and TE 4 in the N by M grid formation of elements. In some examples, each AE of the plurality of AE 6 is electrically coupled to at least one TE of the plurality of TE 4. For instance, FIG. 2 illustrates electrical interconnects 28AA and 30AA between AE 6AA and TE 4AA. Due to the electrical connection between AE 6AA and TE 4AA, AE 6AA and TE 4AA are functionally coupled and not functionally isolated. In some examples, each AE of the plurality of AE 6 is functionally isolated from each FE of the plurality of FE 2. In some examples, AE 6 share common power and/or ground supplies with TE 4 and FE 2, but none of the AE 6 share a functional interconnection with any of the FE 2. In other examples, at least one TE 4 may share a functional interconnection with at least one FE 2.

Each AE 6 of the plurality of AE 6 is configured to relay an electrical stimulus to at least one of TE 4 with which the AE 6 is associated. In some examples, the at least one TE 4 associated with the AE 6 is configured to generate a parametric output in response to the electrical stimulus. For example, controller 14 may select (e.g., enable) AE 6AA by applying a voltage and/or current to enable line 20A and enable line 22A. In addition, controller 14 may command source 16 to output a stimulus signal (e.g., voltage and/or current signal) to stimulus line 24. AE 6AA may receive the stimulus signal from source 16 and relay the stimulus signal over interconnection 28AA to TE 4AA.

Each AE 6 of the plurality of AE 6 is further configured to output a response (e.g., a parametric response) received from the respective at least one associated TE 4 of the plurality of TE 4. For example, in response to the stimulus signal received over interconnection 28AA, TE 4AA may generate a parametric output (e.g., voltage and/or current output) at interconnection 30AA. In response to the parametric output received via interconnection 30AA, AE 6AA may output the parametric response on response line 26. Controller 14 may receive the parametric output from AE 6AA via response line 26.

Controller 14 is configured to determine a health status (e.g., a performance level, such as a degradation in performance) of area 1 of IC 12 based on the response of TE 4 to the stimulus, where the response is received via an associated AE 6. For example, in the case of a parametric response by TE 4 to the stimulus and the parametric output generated by AE, controller 14 may determine a health status of IC 12 at or near AE 6AA and TE 4AA based on a comparison between the parametric output received at response line 26 and an expected response to the stimulus signal that source 16 applied at stimulus line 28. The expected response to the stimulus signal can be, for example, a baseline signal stored in a memory of system 10 or IC 12. In some examples, the baseline signal is a signal outputted by TE 4AA in response to a stimulus signal when IC 12 is in a known, acceptable health condition (e.g., in which the performance of IC 12 is not substantially degraded).

In some examples, controller 14 determines that the performance level of the FE 2 located near TE 4AA is satisfactory in response to determining the parametric response measured at response line 26 sufficiently approximates the expected response to the stimulus applied at stimulus line 24. For example, controller 14 can be configured to compare a characteristic of a parametric response at response line 26 to one or more predetermined threshold values or be configured to compare multiple characteristics of a parametric response to a template response. Some example characteristics may include an amplitude, a frequency, and a phase shift of a sinusoidal parametric response. If, for example, the amplitude value of a sinusoidal parametric response exceeds (e.g., is greater than) a predetermined threshold value by more than a predetermined tolerance (e.g., five percent), then controller 14 may identify the region of IC 12 from where the parametric response was generated as having impending degraded performance. As another example, if the amplitude, the frequency, and the phase shift values of the parametric response all exceed respective predetermined threshold values in a template response by more than a predetermined tolerance (e.g., five percent), then controller 14 may identify the region of IC 12 from where the parametric response was generated as having severe or complete degraded performance. The predetermined threshold values and predetermined tolerances may be stored by a memory of IC 12, another memory of system 10 (e.g., external to IC 12), or another memory separate from system 10. In some examples, the threshold values and tolerances may be adjustable, e.g., in response to user intervention.

In addition, in some examples, controller 14 determine that the performance level of the FE 2 located near TE 4AA is not satisfactory in response to determining the parametric response measured at response line 26 does not sufficiently approximate the expected response to the stimulus applied at stimulus line 24. Controller 14 may determine that an unsatisfactory performance level of one or more of the FE 2 located near TE 4AA indicates that performance of area 1 of IC 12 has degraded or is about to degrade beyond optimal levels.

In some examples, controller 14 generates a notification that indicates the determined health status (e.g., performance level). The notification can be, for example, a signal or flag generated by controller 14, or a visual, audible, or somatosensory output generated by controller 14. Controller 14 may, for example, output the notification to an operator, a technician, a BIT computer system, a parametric tester internal to IC 12, or the like, which may further review or confirm whether or not TE 4AA and nearby FE 2 are functioning as expected. In some examples, the notification indicates the risk of premature failure.

At the time of manufacture or fabrication of IC 12, parametric outputs generated by TE 4 may be used to evaluate IC 12 and to confirm correct operation of the design of IC 12. For example, system 10 may be part of a manufacturing quality control mechanism that uses a health status determined by controller 14 based out parametric outputs of TE 4 as a factor in determining whether IC 12 passes a quality check. During operational use, parametric outputs from TE 4 may be used to verify that no unexpected change in the performance of IC 12 has occurred. For example, system 10 may be part of a security mechanism configured to detect unauthorized tampering with IC 12. If controller 14 determines, based on the parametric output of one or more TE 4 in response to stimuli, that an unexpected change in a health status of IC 12 has occurred, then controller 14 of system 10 can take a responsive action, such as by generating a notification (e.g., by alerting a security mechanism) indicative of a risk of premature failure of IC 12, increasing a frequency of future health status checks of IC 12, or causing the security mechanism to a initiate mitigation process and to prepare for imminent failure of IC 12 and/or system 10. Other responsive actions may include one or more of transmitting an alert (e.g., activating an alarm such as a broadcast or transmission of an alert or transmitting an alert to a remotely located person or device via wired or wireless communication techniques), destroying IC 12, disabling system 10, and implementing mitigating or circumventing measures.

Illustrating AE 6, TE 4 and FE 2 in FIG. 2 as separate elements, rather than combining these elements into a single block, illustrates a benefit of a regularized grid topography, e.g., a uniform arrangement of elements used in IC 12 health status checks. In examples in which IC 12 is installed in a system where security is of relatively high importance (e.g., defense systems, financial systems, critical infrastructure systems, or medical systems), imperfections in IC 12 arising from the manufacturing process (e.g., IC 12 fabrication process) may result in an unexpected and premature failure of IC 12. Imperfections may be caused accidentally or deliberately by human or mechanized tampering. The risk of a latent failure may be minimized by interspersing AE 6 and TE 4 with FE 2 and including a proportionately high number of AE 6 and TE 4 in a particular area 1 of IC 12 as compared to the number of FE 2 included in the area 1; these measures may increase the number of surrogate elements of IC 12 with which controller 14 may determine the health status of FE 2.

Should IC 12 include a systematic defect as a result of the fabrication/manufacturing process, regularization may cause the defect to effect TE 4 and FE 2, and not just FE 2, thereby allowing the defect to be detected after manufacturing or in operation. If a defect is not systematic but more random, a relatively large number of TE 4, and, in some examples, a daisy-chain arrangement of TE 4 described below with respect to FIGS. 4 and 5, may increase a likelihood of controller 14 detecting the random defect.

Interspersing TE 4 and AE 6 with FE 2 (e.g., in a uniform arrangement or a non-uniform arrangement) may also allow for compartmentalization and/or regularization of critical design information associated with the design of IC 12. For example, a portion of the design of area 1 of IC 12, which contains a grid formation of AE 6, TE 4, and FE 2 and the underlying transistors within AE 6, TE 4 and FE 2, could be shared with and fabricated by a first IC manufacturing facility without sharing the portion of the design that includes the interconnections between TE 4, AE 6, enable lines 22, response line 26, and stimulus line 24. In this context, a manufacturing facility may represent a temporal phase in manufacturing and/or a physical location where manufacturing is occurring. The portion of the design of IC 12 that does contain interconnections, enable lines 22, response line 26, and stimulus line 24 could then be shared with a different (e.g., second) IC manufacturing facility (e.g., a different temporal phase in manufacturing) without sharing the portion of the design of IC 12 that includes the grid formation of AE 6, TE 4, and FE 2 and the underlying transistors within AE 6, TE 4 and FE 2. In this way, the first manufacturing facility and/or manufacturing phase where transistor fabrication occurs may have no knowledge about which of the transistors on IC 12 were being configured as individual FE 2, AE 6, and TE 4 because the design information is being compartmentalized so that each manufacturing facility and/or phase only receives a portion of the entire design. This separation of knowledge about the design of IC 12 may help prevent tampering with IC 12.

In some cases, an adversary may attempt to reverse engineer the design of IC 12 by identifying critical functions performed by a single FE 2 or group of FE 2 based on a configuration of transistors within the single FE 2 or group of FE 2. Compartmentalization and/or regularization of critical design information, and, in some examples, along with a uniform arrangement of TE 4, AE 6, and FE 2 associated with IC 12, can help prevent such reverse engineering attempts. Without compartmentalization, a manufacturer could include a deliberate localized defect affecting one or more critical FE 2 of IC 12 while avoiding other less critical FE 2.

In some examples, the transistors within each of the FE 2 may be indistinguishable from the transistors that are within each of the AE 6 and TE 4, and as a result, the first fabrication facility may have no way of identifying elements of IC 12 that provide functionality to IC (e.g., FE 2). If the first manufacturer adds defects to IC 12 at random (and without a priori knowledge of any specific effect to a function of IC 12 caused by the defects), the defects may inadvertently affect one or more TE 4. If the defects affect one or more TE4, then the unexpected parametric outputs generated by the one or more affected TE 4 and outputted at response line 26 may allowing the defects to be detected by controller 12 (or another controller) after manufacturing of IC 12 is complete.

Although system 10 is described herein as using electrical connections, electrical stimuli, and other electrical systems, these descriptions should in no way be construed as limiting. For example, source 16 may be configured to generate a magnetic stimulus, a mechanical stimulus, an optical stimulus, an acoustic stimulus, a biologic stimulus, and/or other stimulus recognized by AE 6AA and suitable for generating a corresponding response at TE 4AA. Likewise, controller 14 may be configured to receive a magnetic response, a mechanical response, an optical response and/or other response that is capable of being outputted by AE 6AA and TE 4AA in response to a corresponding stimulus.

Figure 3:
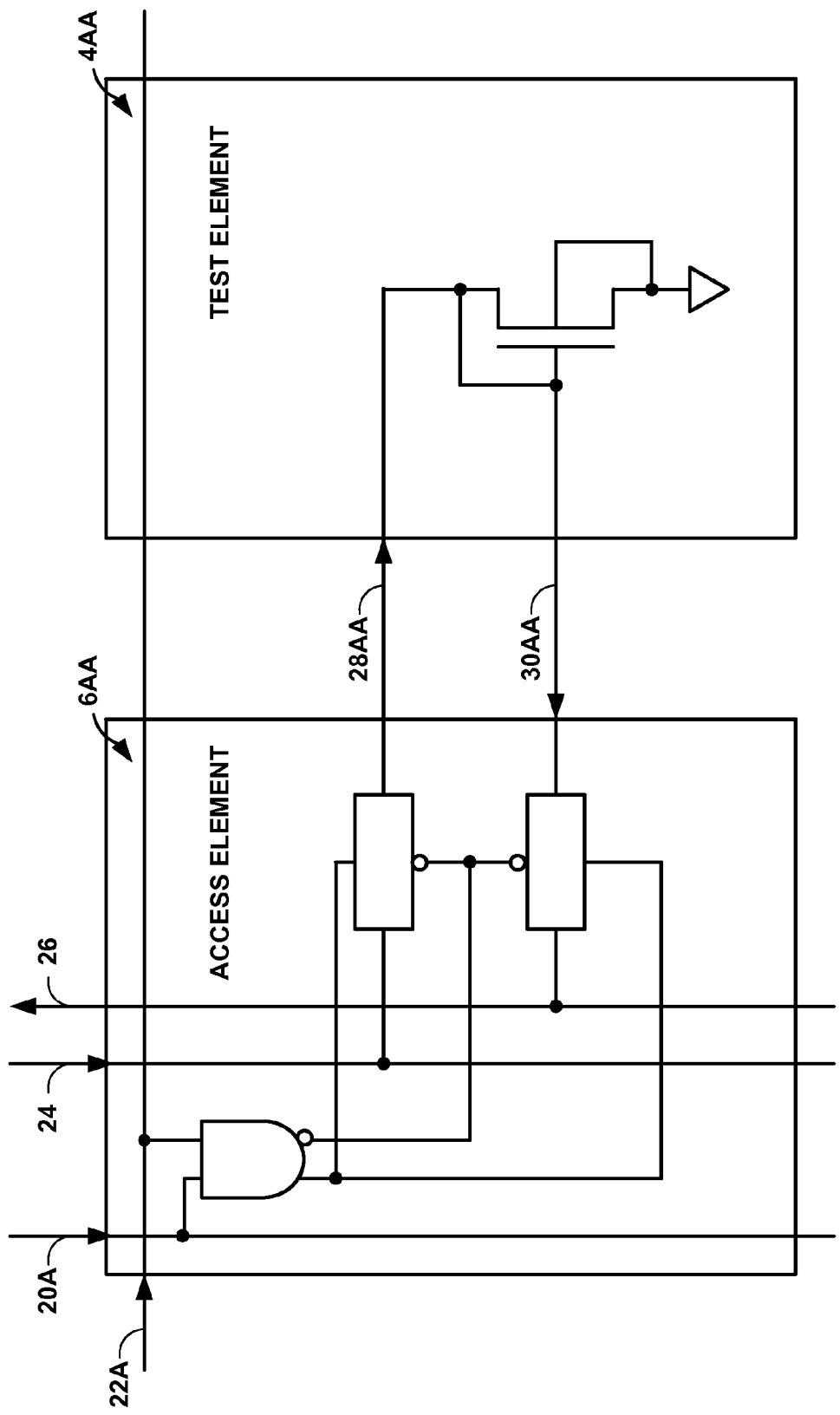
FIG. 3 is a block diagram illustrating an example access element and an example test element configured to test performance of an example area of an example integrated circuit device, in accordance with one or more aspects of the present disclosure.

FIG. 3 is a block diagram illustrating example AE 6AA and example TE 4AA configured to test and measure performance of example area 1 of example IC 12, in accordance with one or more aspects of the present disclosure. FIG. 3 illustrates an exploded view of AE 6AA and TE 4AA of FIG. 2 and is described below within the context of FIG. 2 and system 10 of FIG. 1. While AE 6AA and TE 4AA are primarily referred to in the description of FIG. 3, in other examples, the description of AE 6AA and TE 4AA may also apply to other AE and TE of area 1.

In the example of FIG. 3, AE 6AA includes an analog switch or transmission gate and TE 4AA includes a complimentary metal-oxide-semiconductor negative channel field effect transistor (CMOS NFET) device. Although not shown in FIG. 3, in examples in which TE 4AA includes a field-effect transistor, separate connections may be used to connect AE 6AA to two or more of the gate, drain, and source terminals of TE 4AA. FIG. 3 illustrates one example of AE 6AA and TE 4AA and IC 12 can include other types of AE 6AA and TE 4AA in other examples. For example, TE 4AA and AE 6AA may each be any selectable semiconductor element implanted in IC 12 and configured to receive an electrical stimulus at a stimulus net (e.g., stimulus line 24) and output a parametric response at a response net (e.g., response line 26).

Although illustrated as a single transistor and analog switch, in other examples, TE 4AA and AE 6AA may have other configurations. For instance, TE 4AA and 6AA may each include any suitable one or more digital and analog electrical components, such as, but not limited to, resistors, diodes, inductors, capacitors, inverters and the like. In addition, TE 4AA and 6AA may each include other combinations of electrical, mechanical, micro electrical-mechanical, acoustical, biological, chemical, and optical devices capable of generating a response to controller 14 in response to a stimulus from source 16, where the response is indicative of the health status of IC 12 (or another system).

In some examples, IC 12 is configured to condition a stimulus generated by source 16. The signal conditioning may be performed by TE 4AA or by another element external to TE 4AA.

Controller 14 is configured to conduct a health status check of (e.g., a performance test) of TE 4AA by selecting AE 6AA and causing source 16 to apply a known current at stimulus line 24. After causing source 16 to apply a known current at stimulus line 24, controller 14 can compare a parametric output (e.g., a signal characteristic of a voltage signal) at response line 26 to an expected output from TE 4AA and determine a health status of TE 4AA, e.g., determine whether performance degradation of TE 4AA has or is about to occur.

For example, controller 14 can select AE 6AA by simultaneously asserting (e.g., applying a particular voltage or current at) both enable lines 20A and 22A. AE 6AA is electrically coupled to TE 4AA via electrical interconnections 28AA and 30AA. When controller 14 selects AE 6AA, controller 14 may control source 16 to output a stimulus current at stimulus line 24. AE 6AA can receive the current via stimulus line 24 and relay the current over interconnection 28AA to a stimulus net of TE 4AA (e.g., a stimulus input, a stimulus node, a stimulus wire, and the like of TE 4AA). In response to the known current at the stimulus net, TE 4AA may generate a response voltage at a response net (e.g., a response output, a response node, a response wire, and the like of TE 4AA) connected to interconnection 30AA. AE 6AA is configured to receive the response voltage from TE 4AA can via electrical interconnection 30AA. AE 6AA is further configured to relay the response voltage generated by TE 4AA out to response line 26. Controller 14 is configured to receive the response voltage at response line 26.

Controller 14 can compare the response voltage (e.g., a type of parametric output) received by controller 14 to an expected voltage (e.g., stored in a memory accessible to controller 14) to determine whether performance of TE 4AA has or is about to degrade below an acceptable level. Controller 14 may determine TE 4AA has or is about to degrade below an acceptable level (e.g., is a faulty TE) in response to determining the parametric output at response line 26 is outside of a predetermined range of the expected voltage. In response to determining the parametric output at response line 26 is within the predetermined range of the expected voltage, controller 14 may determine, TE 4AA is functioning properly.

The parametric output received by controller 14 at response line 26 may fluctuate based on changes to the known current applied by source 16 at stimulus line 24. For instance, TE 4AA may generate and AE 6AA may output a particular voltage based on a particular known current and a different voltage based on a different known current. Small changes to the known current applied by source 16 at stimulus line 24 can cause small changes in the parametric output received by controller 14 at response line 26. Because controller 14 receives a parametric output (and not simply a digital output) from AE 6AA at response line 26, relatively minor changes in the voltage associated with the parametric output can be observed and measured over time.

In some examples, for instance in applications in which more precision is desired, controller 14 may be configured to detect a voltage change on the order of microvolts (e.g., 10 microvolts or less). In other examples, for instance in applications in which less precision is required, controller 14 may be configured to detect a voltage change on the order of one or more hundreds of millivolts, volts, and the like. Still in other examples, controller 14 may detect a change on the order of one or more picoamps, milliamps, and the like.

In any event, these minor changes may be indicative of a degradation in performance of TE 4AA over time, such that controller 14 may monitor a trend in the health status of TE 4AA over time. This type of incremental health status monitoring may be more useful for detecting IC 12 performance degradation with sufficient time to take a responsive action and for identifying a source of the performance degradation compared to a binary health status determination (e.g., a logical value) that only indicates whether TE 4AA is in an acceptable health status or a unacceptable health status.

In one example, controller 14 performs multiple performance tests of area 1 over a period of time. Controller 14 may identify a change in the parametric outputs received from AE 6AA and determine, based on the change in parametric outputs, that IC 12 has a reliability or a performance deterioration issue at the location (e.g., the part of area 1) of IC 12 where TE 4AA is installed. In this way, these parametric outputs received from AE 6AA via TE 4AA provide data with which controller 14 can assess or monitor the health of IC 12 over time. For instance, controller 14 may determine that a change which exceeds a threshold (e.g., on the order of microvolts, millivolts, and the like) indicates that a degradation in the health of IC 12 has occurred. In addition, controller 14 can output these parametric responses to a larger monitoring system/circuit that, in response to the change, can take one or more responsive actions, e.g., to prevent a potential failure of IC 12 and system 10. For instance, one precautionary step to prevent a failure of IC 12 may be to modulate the operating conditions of IC 12 (e.g., add cooling by the monitoring system) or invoke a spare IC and bypass IC 12.

In some examples, controller 14 may determine that a parametric output received from AE 6AA and generated by TE 4AA represents an expected parametric output in response to determining the parametric output sufficiently approximates an expected response to the stimulus applied by source 16. The one or more characteristics of an electrical signal indicative of the expected response to the stimulus applied by source 16 may be, for example, stored by a memory of IC 12 or a memory of another device. The one or more signal characteristics can include, for example, one or more of an amplitude or a frequency. Controller 14 may, for example, determine that if the signal characteristic of the parametric output received from AE 6AA and generated by TE 4AA is within a threshold range of the stored signal characteristic, then the parametric output received from AE 6AA and generated by TE 4AA represents an expected parametric output. Controller 14 may determine that expected parametric outputs indicate that FE 2 located near TE 4AA are operating within the desirable performance parameters (e.g., normally).

Controller 14 may determine that the parametric output represent an unexpected parametric output in response to determining the parametric output does not sufficiently approximate an expected response to the stimulus applied by source 16. Controller 14 may, for example, determine that if the signal characteristic of the parametric output received from AE 6AA and generated by TE 4AA is not within a threshold range of the stored signal characteristic, then the parametric output received from AE 6AA and generated by TE 4AA does not represent an expected parametric output. Controller 14 may determine that unexpected parametric outputs generated indicate that FE 2 located near TE 4AA are not operating within the desirable performance parameters (e.g., abnormally) or that TE4AA is a faulty TE.

In addition, in some examples, controller 14 may determine that unexpected parametric outputs generated by more than one TE 4, that are collocated in a single area 1 of IC 12, indicates a localized performance problem of nearby FE 2 within that area of IC 12. In some examples, this determination by controller 14 is bolstered in response to a determination by controller 14 that other TE 4, located in a different area of IC 12, do not generate unexpected parametric outputs. In some examples, if controller 14 determines that a seemingly random quantity of TE throughout the IC generate unexpected parametric responses during a test, results while other TE generate expected parametric responses, controller 14 may determine that a sparse but nonetheless significant random defect or performance problem exists. In some examples, controller 14 may determine that unexpected parametric outputs generated by some, all, or nearly all TE 4 of IC 12 indicate imminent failure of IC 12. In some examples, for instance in applications in which more precision is required, controller 14 may be configured to detect a sudden voltage change on the order of microvolts (e.g., less than 10 microvolts). In other examples, for instance in applications in which less precision is required, controller 14 may be configured to detect a sudden voltage change on the order of one or more hundreds of millivolts, volts, and the like. Still in other examples, controller 14 may detect a sudden change on the order of one or more picoamps, milliamps, and the like. In these examples, controller 14 may determine that a sudden change has occurred if the measured parameter (e.g., voltage, current, and the like) exceeds an adjustable or a fixed threshold (e.g., on the order of microvolts, picoamps, and the like).

In one example, controller 14 determines whether unexpected parametric outputs generated by some, all, or nearly all TE 4 of IC 12 indicate a faulty test of IC 12 and not necessarily an imminent failure of IC 12. For example, IC 12 may include one or more access elements and test elements that each have characteristics of being highly-reliable. These access elements and test elements may be referred to as "golden" elements and may be more robust than other TE 4 and AE 6 of area 1, such that the golden elements may maintain their integrity (e.g., operate within desirable parameters) in relatively harsh operating environments, even while other TE 4 and AE 6 of area 1 fail. For example, the golden elements may be configured to withstand a higher operating temperature, vibration environment, and the like without failure compared to the other TE 4 and AE 6 of area 1. Similar to a test and calibration standard, a golden element may almost never generate an unexpected parametric output in response to a known stimulus.

In some examples, a golden element is similar or substantially identical (e.g., nearly identical or identical in structure) to a functional element of IC 12, and in application (e.g., during operational use), the golden element is disconnected from system power and/or input signals. As a result, the golden element may not experience wear or damage that may occur to other elements of IC 12 as a result of receiving system power and/or input signals during operational use. Therefore, when a golden element is tested, the golden element can serve as a reference by which to compare perceived performance degradation in the other elements that have been in operational use and/or under stress of some type. Examples of a golden element include, for example, a metal-oxide-semiconductor field-effect transistor (MOSFET) transistor, a capacitor, a wire, a resistor, a diode, and the like. In addition, a MOSFET having a thicker gate oxide and longer channel length than other MOSFET devices may be more resistant to degradation and therefore be better suited as a golden element. This type of MOSFET may be more suited for repeated verification of measurement fidelity (e.g., testing calibration) even if this improved MOSFET does not identically represent the other MOSFETS.

Other examples of golden elements may also include "anti-golden" elements. Anti-golden elements may be similar or substantially identical (e.g., nearly identical or identical in structure) to a functional element of IC 12, but during the operational life of the system or device, anti-golden elements are deliberately placed under excessive stress (e.g., receiving more power and/or input signals than the other elements of IC 12) such that a parametric output from an anti-golden element may be an early indicator of impending failure and/or device degradation. An example of an anti-golden element may be a "thin" MOSFET device that in some examples includes a thinner gate oxide and/or shorter channel length than other MOSFET devices. A "thin" MOSFET device may have characteristics such that degradation occurs quickly (e.g., the effects of degradation are amplified) during operational and under normal wear and tear.

Controller 14 may control source 16 to deliver a stimulus to a golden TE using any of the techniques described above with respect to TE 4. Controller 14 may receive a parametric output generated by the golden TE in response to a stimulus from source 16 (and received via a AE associated with the golden TE) and compare at least one characteristic of the parametric output (e.g., an amplitude or frequency of a received signal) to a stored threshold or template signal in order to determine whether the parametric output generated by the golden TE is within a threshold range of the expected parametric output for a healthy, functional golden TE. In some examples in which area 1 includes one or more golden AE and TE pairs, controller 14 may determine that any unexpected parametric output generated by a golden TE in response to a stimulus from source 16 (and received via a AE associated with the golden TE) indicates a test or test setup failure and not a failure specific to IC 12. Thus, in some examples, in response to determining any unexpected parametric output generated by a golden TE in response to a stimulus from source 16 indicates a test or test setup failure and not a failure specific to IC 12, controller 14 may initiate another test of the golden TE or another TE 4 of area 1, or may generate a notification that indicates the test or test setup failure or the failure not specific to IC 12. The notification may be, for example, a signal or flag generated by controller 14, or a visual, audible, or somatosensory output generated by controller 14.

In some examples, controller 14 determines whether IC 12 has been tampered with based on one or more parametric outputs generated by respective TE 4 and received by controller 14 via response line 26. For example, controller 14 may identify a sudden change in performance of area 1 of IC 12 as an indication of tampering. For example, at one point in time controller 14 may detect a first parametric output generated by one or more TE 4 in response to a first stimulus signal and, at a second later point in time, controller 14 may detect a second parametric output generated by the same one or more TE in response to a second stimulus signal having the same parameters as the first stimulus signal. The time duration between the first and second points in time may be short (e.g., on the order of minutes, hours, or days, such as one day) as compared to the expected operating of IC 12 (e.g., on the order of years, such as one year).

In response to determining that a difference between one or more characteristics of the first and second parametric outputs is greater than or equal to a predetermined threshold, controller 14 may determine that the integrity of TE 4, and, therefore, IC 12 may be compromised, e.g., due to tampering. In response to detecting the change in integrity of TE 4, controller 14 may generate a notification, which may be the same as or similar to the types of notifications discussed above. The threshold may indicate, for example, the amount of change in the one or more characteristics that is expected based on, e.g., the normal wear of IC 12 related to operation of IC 12 and unrelated to deliberate tampering with IC 12. Changes in the one or more characteristics of a parametric output between the first and second points in time that is greater than the threshold value may be classified as a sudden change. The sudden change may indicate, for example, that a TE 4 has been tampered with, such that the TE 4 is not performing as expected. Because TE 4 and the AE 6 are functionally isolated from the FE 2 of IC 12, controller 14 can detect an instance of tampering at any point in the lifecycle of IC 12, without interfering with the FE 2, and the functional operations of IC 12. In some instances, tampering may involve adding an element to IC 12 that affects one or more FE 2. Such an element may be difficult to detect because the element may be but one component interspersed within the millions or billions of FE 2 of IC 12. In other instances, tampering may involve identifying and avoiding causing interference with the TE 4 and AE 6.

Designing IC 12 with a statistically proportionate number of TE 4 and AE 6 as compared to the number of FE 2, relatively uniformly interspersing the TE 4 and AE 6 in the FE 2, or both, may increase a likelihood that controller 14 can detect tampering with IC 12 and decrease a likelihood that TE 4 and AE 6 can be identified and avoided by the adversary during tampering with IC 12. The likelihood that a component added through tampering will affect one or more TE 4 and AE 6, and as such can be identified by controller 14 from an unexpected parametric response, may increase as the uniformity and the number for TE 4 and AE 6 increases.

In some examples, at least one of each of the FE 2, TE 4, and AE 6 of IC 12 are all based on similar generic device building blocks. For example, each of the FE 2, TE 4, and AE 6 may be identical in design (e.g., having multiple switches, gates, transistors, and the like) however in operation, IC 12 may utilize only some of the built in functionality of each element to perform a different operation of IC 12 (e.g., an access operation of an access element, a test operation of a test element, or a functional operation of a functional element). In other words, while AE 6AA and TE 4AA are illustrated as two distinct electrical designs, each may include the circuitry of the other, but only circuitry particular to an access element may be used by AE 6AA and only circuitry particular to a test element may be used by TE 4AA. The use of generic devices allows IC 12 to be manufactured without the manufacturer being aware of the final use of IC 12. Adding test devices within this framework makes it more difficult to identify a critical device within the component, and makes it more statistically likely that a malicious agent will unknowingly intersect one or more test devices, allowing detection and evaluation. In some examples, each of the FE 2, TE 4, and AE 6 of IC 12 are all based on similar generic device building blocks.

In other examples, each of the FE 2, TE 4, and AE 6 of IC 12 have different configurations and are not based on similar generic device building blocks.

In some examples, IC 12 may include one or more dedicated parametric testers built-into the die of IC 12 for applying a stimulus current and/or voltage to stimulus line 24 and measuring a response voltage and/or current at response line 26. For example, controller 14 and source 16 of system 10 of FIG. 1 may be configured as a parametric tester that resides within IC 12 to provide on chip testing capability of IC 12. In this way, the on chip parametric tester can perform performance tests of IC 12 during manufacturing and post manufacturing after installation of IC 12 in a larger system (i.e., in-situ). The parametric tester may reside inside or outside of area 1.

In some examples, in addition to controller 14 and source 16, the one or more parametric testers may include one or more voltage-output and current-output Digital to Analog Converters (DAC), as well as one or more voltage-input and current-input Analog to Digital Converters (ADC). The one or more parametric testers may perform common tests across multiple AE 6 and TE 4 and may further include control mechanisms (e.g., for asserting enable lines 20 and 22), calibration mechanisms, on chip data storage, and comparison mechanisms for interpreting parametric outputs generated by TE 4 and AE 6 from the tests. These resident parametric testers, while convenient, may not be as elaborate and complex as other parametric testers that may exist outside the die of IC 12 (e.g., dedicated manufacturing parametric testers). These built-in parametric testers may provide a relatively convenient mechanism for testing IC 12 at any time during normal operation. For instance, one or more of the parametric testers may output performance test data to a larger system that performs overall BIT or in-system checks of the health of IC 12 as well as surrounding circuits within a system.

The parametric tester of IC 12 may be electrically coupled to enable lines 20, enable lines 22, stimulus line 24, and response line 26. The parametric tester may be configured to assert one or more enable lines 20, and assert one or more enable lines 22 to select one or more AE 6. Once the parametric tester selects one or more AE 6, the parametric tester may be configured to generate an electrical stimulus over stimulus line 24 that the one or more selected AE 6 relays to TE 4. In addition, the parametric tester may be configured to receive a parametric response outputted by the one or more selected AE 6 over response line 26.

Once received, the parametric tester may be further configured to store the parametric response outputted by the one or more selected AE 6 as a measurement of voltage and/or a measurement of current. For example, the IC may include on-board memory cells to which the parametric tester can read from, write data to, or both. After receiving a parametric output over response line 26, the parametric tester may store a value associated with the parametric output as data within the built-in memory. As indicated above, the parametric tester may include specific circuitry for generating and receiving the electrical stimulus and electrical response. For example, the parametric tester may include an analog to digital converter for generating the electrical stimulus over stimulus line 24 and a digital to analog converter for receiving the parametric response over response line 26.

In some examples, it may be desirable to determine the health status of one or more electrical connections between FE 2 of IC 12 instead of, or in addition to, the health status of one or more FE 2. As discussed above, one or more TE 4 and AE 6 pairs may be used as a surrogate FE 2 in order to determine the health status of actual FE 2 of IC 12. Similarly, in some examples, the electrical connections between a plurality of TE 4, electrical connections between a plurality of TE 6, or both types of electrical connections may be used as a surrogate for the electrical connections between FE 2. Controller 14 may, in some examples, test the electrical connections between a plurality of TE 4, electrical connections between a plurality of TE 6, or both, in order to detect a potential or actual performance issue with the electrical connections between FE 2 of IC.

Figure 4:
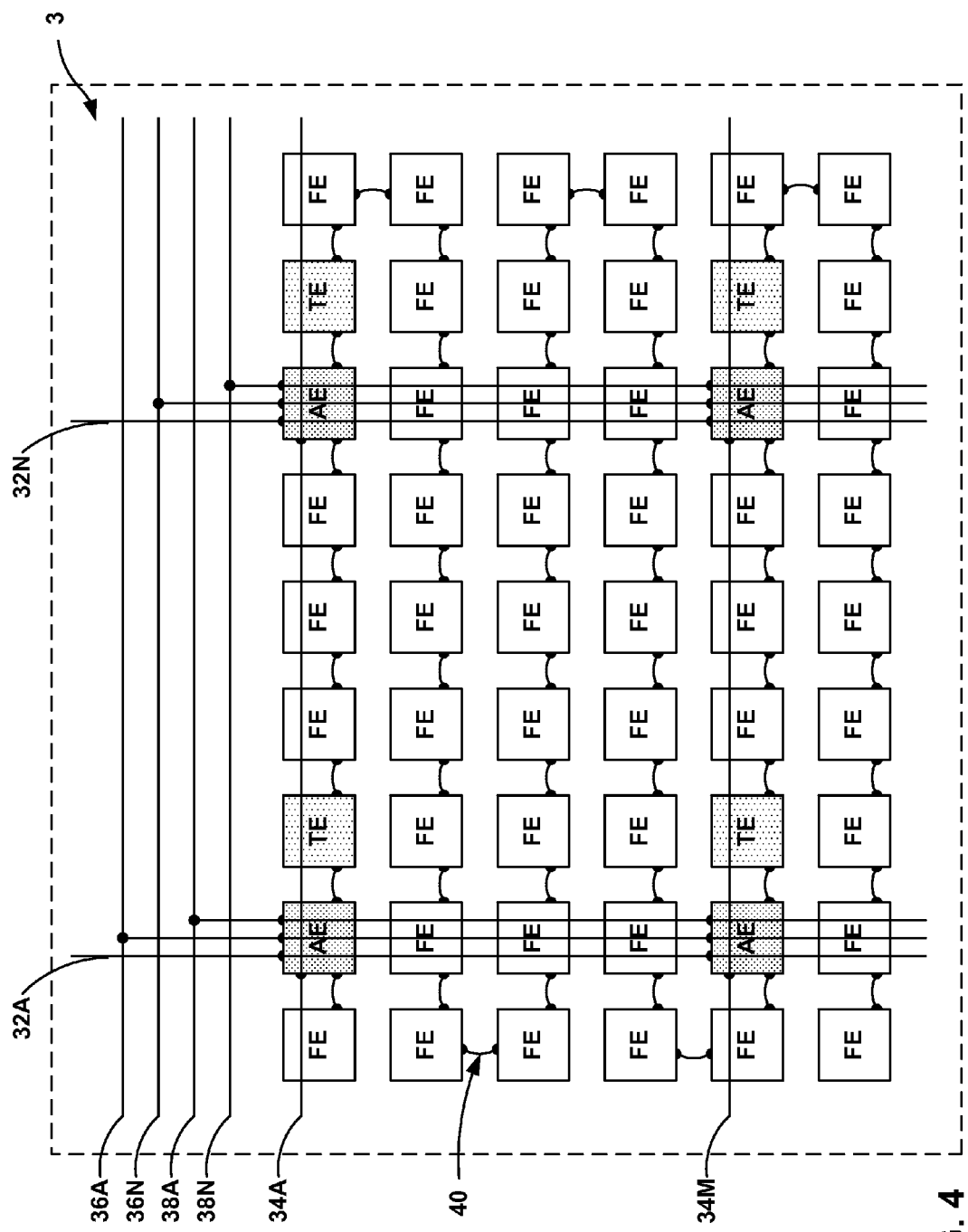
FIG. 4 is a block diagram illustrating an example area of an example integrated circuit device configured to test performance of interconnections in the example area of the integrated circuit device, in accordance with one or more aspects of the present disclosure.

FIG. 4 is a block diagram illustrating example area 3 of an example IC 12 configured to test performance of interconnections 40 in example area 3 of IC 12, in accordance with one or more aspects of the present disclosure. Interconnections 40 define electrically conductive pathways and can include, for example, one or more electrical contacts, vias, or other electrically conductive pathways. Area 3 represents any logical or physical portion of an IC that includes multiple devices and interconnections, such as area 3 of IC 12 illustrated in FIG. 1. FIG. 4 is described below within the context of area 3 of IC 12 and system 10 of FIG. 1.

Area 3 includes a plurality of FE, TE, and AE daisy chained or scan chained via a plurality of interconnections 40. This daisy chain formation of interconnections 40 includes multiple elements (e.g., multiple AE, TE, and FE) interconnected in series via interconnections 40. In other words, interconnections 40 electrically connect a group of AE, TE, and FE in series. The first element (e.g., an AE, a TE, or a FE) in the series is connected to the second element (e.g., an AE, a TE, or a FE) by one of interconnections 40, the second element (e.g., an AE, a TE, or a FE) is connected to the third element (e.g., an AE, a TE, or a FE) by one of interconnections 40, and the like. The configuration of interconnections 40 creates a test path through each of the elements.

Area 3 further includes enable line 32A-32N (collectively "enable lines 32") and enable line 34A-34M (collectively "enable lines 34"). Enable lines 32, 34 enable controller 14 to select or enable one or more access elements in area 3. For example, controller 14 of FIG. 1 can apply a voltage or current signal at two of enable lines 32 and two of enable lines 34 to select two respective AE. Area 3 also shows two stimulus lines 36A and 36N and two response lines 38A and 38N, via which controller 14 may control source 16 (FIG. 1) to simultaneously apply a constant stimulus signals to the daisy chain configuration including two selected AE and via which controller 14 may simultaneously receive two different response signals from the two selected AE. For example, source 16 of FIG. 1 can be electrically connected to stimulus lines 36A and 36N. Controller 14 is electrically connected to response lines 38A and 38N. Controller 14 is configured to enable or select two different AE and command source 16 to apply a stimulus current signal at stimulus line 36A. The stimulus current signal traverses the daisy chain via interconnections 40 and returns to source 16 via stimulus line 36N. In response, controller 14 can receive a first response voltage applied by one AE at response line 36A and a second response voltage applied by a different AE at response line 36N.

The daisy chain configuration of interconnections 40 in area 3 of IC 12 can be used to simultaneously test interconnections 40 for performance level deterioration during operational use of IC 12 (e.g., while the FE in area 3 perform functional operations for IC 12). In other words, a long daisy chain formation of FE, TE, and AE such as this may provide a means for evaluating performance, reliability, health, and the like, of many interconnections 40 interconnecting multiple elements of area 3. For example, controller 14 may command source 16 to apply a constant current signal to IC 12 at stimulus lines 36A, and the current signal may traverse the daisy chain configuration via interconnections 40 and return to source 16 via stimulus line 36N. Over time, controller 14 can select one or more AE while the constant current signal is still being applied. Controller 14 can receive a parametric output from the selected AE at response lines 38A and 38N and determine a change in these parametric outputs to determine whether performance deterioration of interconnections 40 has or is about to occur IC 12. Based on these changes, controller 14 can determine overall a performance health level of area 3 during normal operation of IC 12. FIG. 4 is described below in more detail with respect to FIG. 5.

Figure 5:
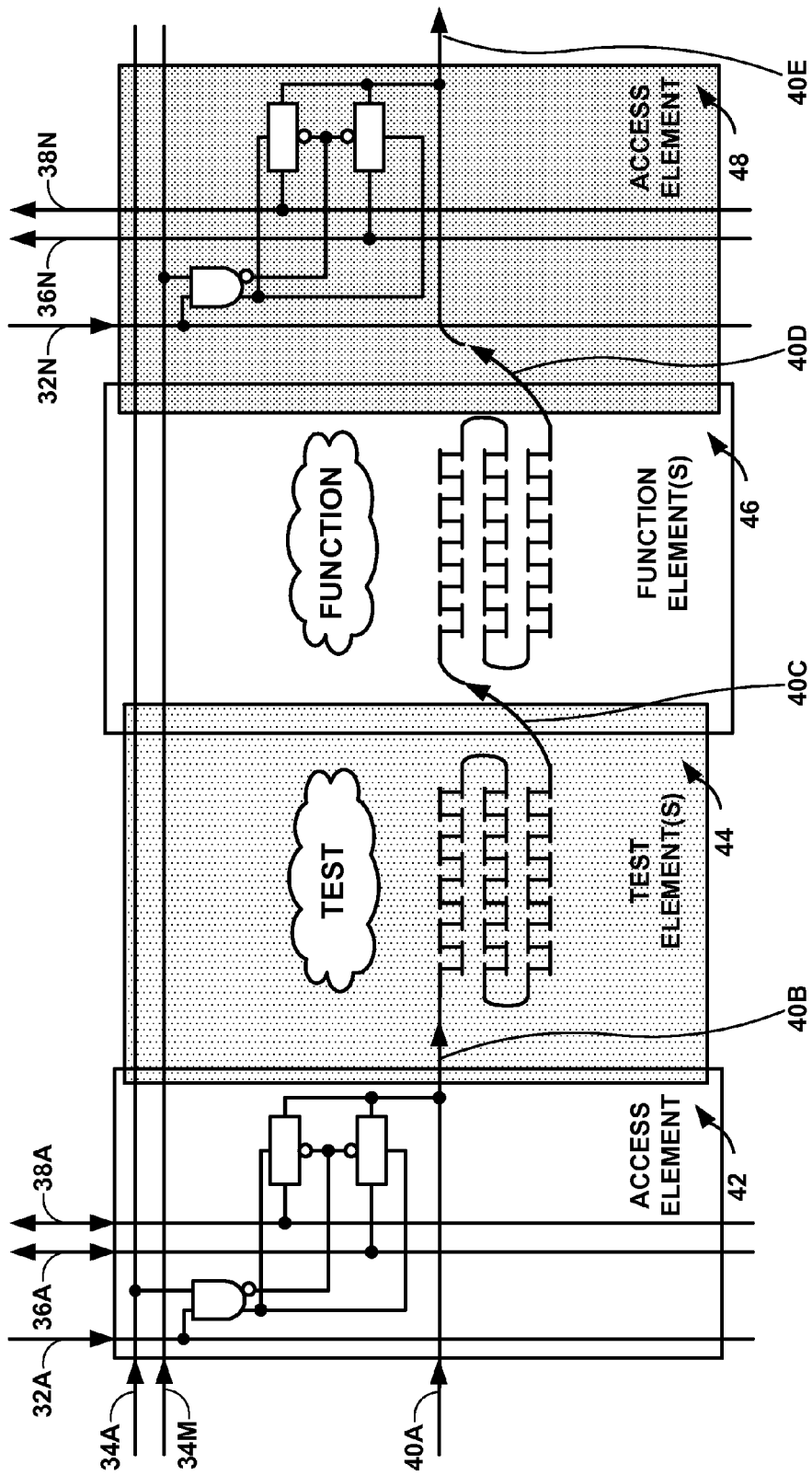
FIG. 5 is a block diagram illustrating example access elements, example test elements, and example functional elements configured to test performance of interconnections in an example area of an example integrated circuit device, in accordance with one or more aspects of the present disclosure.

FIG. 5 is a block diagram illustrating a plurality of interconnections 40A-40E, a plurality of example access elements 42 and 48 (AE 42, 48), a plurality of example test elements 44 (TE 44), and a plurality of example functional elements 46 (FE 46) configured to test performance of interconnections 40 in example area 3 of an example IC 12, in accordance with one or more aspects of the present disclosure. FIG. 5 illustrates an exploded view of an example daisy chain formation of FIG. 4 and is described within the context of FIG. 4.

Interconnections 40A-40E collectively represent a subset of interconnections 40 of FIG. 4. Controller 14 is configured to test a subset of interconnections 40, e.g., interconnections 40A-40E, of the daisy chain formation of area 3 through selection of two AE, such as AE 44 and AE 48. A test of a portion of the daisy chain between AE 44 and 48 may stress (e.g., via the application of an electrical stimulus) and test interconnections 40, including interconnections 40B-40D, found between FE 46 and TE 44.

For instance, AE 44 may bound the start of a portion of the daisy chain of area 3 and a second AE such as AE 48 may bound the end of the daisy chain. AE 44 and AE 48 are representative first and last elements in the daisy chain configuration. Interconnections 40B-40D, as well as the interconnections between each of TE 44 and between each of FE 46, represent the segment of interconnections 40 tested by controller 14 when AE 44 and AE 48 are selected by controller 14. Controller 14 can simultaneously assert enable lines 32A, 32N, 34A, and 34M to select and enable AE 42 and AE 48. Controller 14 can further control source 16 to apply an electrical stimulus at stimulus line 36A when AE 44 and AE 48 are selected. This electrical stimulus travels through AE 42 to TE 44 via interconnection 40B. The electrical stimulus further travels from TE 44 to FE 46 via interconnection 40C. From FE 46, the electrical stimulus traverses interconnection 40D to AE 48. Controller 14 can measure a parametric output (e.g., a parametric electrical response) of the elements of the daisy chain to the stimulus applied by AE 48 at stimulus line 36A at response line 38N. Controller 14 can determine a difference between this parametric output and an expected output using any suitable technique, such as the ones described above with respect determining a health status of test elements based on a parametric output, to determine whether area 3 of IC 12 is performing as expected or the performance of some or all of interconnections 40B-40D may be deteriorating.

In some examples, AE 42 and AE 48 are different access elements. In other examples, AE 42 and AE 48 are the same access element. In other words, in some examples, AE 42 may be a first access element that the electrical stimulus from controller source 16 travels through to TE 44, and AE 48 may be a second access element from which controller 14 measures the parametric response from TE 44 and FE 46. In other examples, controller source 16 transmits the electrical stimulus through AE 42 and measures the parametric response at the same AE.

Figure 6:
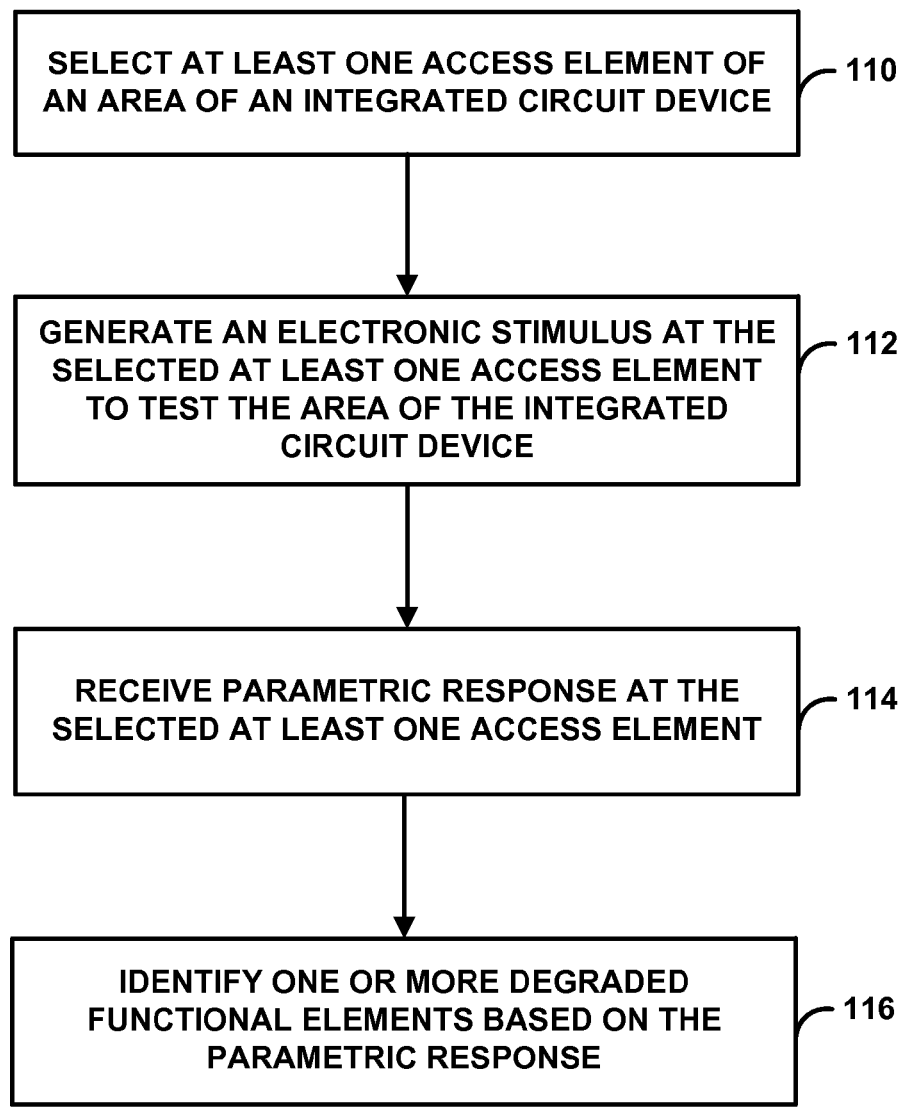
FIG. 6 is a flowchart illustrating an example technique for testing performance of an example integrated circuit device, in accordance with one or more aspects of the present disclosure.

FIG. 6 is a flowchart illustrating an example technique for determining the health status of an IC, in accordance with one or more aspects of the present disclosure. While FIG. 6 is described below with respect to system 10 of FIG. 1 and area 1 of IC 12 of FIG. 2, in other examples, the technique shown in FIG. 6 may be implemented by another system.

In the technique shown in FIG. 6, controller 14 selects at least one AE 6 of area 1 of IC 12 (110). For example, to test a region near AE 6AA of area 1, controller 14 may electrically assert enable lines 20A and 22A. In some examples, controller 14 is part of a parametric tester built into the die of IC 12 and configured to perform periodic performance tests of area 1. In other examples, controller 14 may be a part of a parametric tester that is external to IC 12. In some examples, AE 6AA may include an analog switch and logic that enables AE 6AA to act as a stimulus net and a response net (e.g., a stimulus input wire and a response output wire) when selected by controller 14.

After controller 14 selects AE 6AA, controller 14 may control source 16 to generate and deliver an electrical stimulus at the selected at least one AE to determine the health status of area 1 of IC (120). For example, while AE 6AA is selected, controller 14 may command source 16 to apply an electrical stimulus at stimulus line 24. In some examples, source 16 is part of the built-in parametric tester that resides within the packaging of IC 12, while, in other example, source 16 is external to IC 12. AE 6AA is configured to relay the electrical stimulus to the associated TE 4AA via interconnection 28AA. In some examples, TE 4AA includes a CMOS NFET devices that generates an electrical response at interconnection 30AA when an electrical stimulus is applied at interconnection 28AA.

Controller 14 receives the parametric response generated by TE 4AA in response to the stimulus via the selected at least one AE 6AA associated with the TE 4AA. For example, the electrical response at interconnection 30AA may pass through the circuitry of AE 6AA to response line 26. At response line 26, controller 14 may receive the electrical response and compare the response to an expected response to determine a health status of TE 4AA. For example, the parametric response may include an analog electrical signal, and controller 14 may determine that the performance of TE 4AA, and, therefore, possibly functional elements in area 1, has deteriorated beyond desirable level in response to determining a signal characteristic of the electrical signal generated by TE 4AA differs from a stored value by a threshold amount.

In the technique shown in FIG. 6, controller 14 identifies one or more potentially degraded functional elements of the plurality of functional elements 2 based on the parametric response generated by TE 4AA and received by controller 14. For example, if the parametric response received by controller 14 at response line 26 does not approximately correspond to an expected response to the electrical stimulus, controller 14 may flag one or more FE 2 of IC 12 that are co-located within a predefined distance of AE 6AA, TE 4AA, as having degraded performance. For example, the IC may be divided into a plurality of predefined areas and controller 14 may determine that if one AE, TE in a predefined area has degraded performance, then all the FE in the area also likely have degraded performance. In other examples, controller 14 may determine degraded performance in an area has occurred only after determining multiple AE, TE in the predefined area have degraded performance. Controller 14 may rely on a threshold that could be adjusted to flag one or more FE 2 in an area if the quantity of AE, TE in the predefined area that have degraded performance exceeds the threshold.

The term "controller" as used herein may refer to any suitable structure configured to implement the techniques described herein. In addition, in some aspects, the functionality attributed to controller 14 and described herein may be provided within dedicated software modules or hardware modules configured for performing the techniques of this disclosure. Even if implemented in software, the techniques may use hardware, such as a processor, to execute the software, and a memory to store the software. In any such cases, the controllers described herein may define a specific machine that is capable of executing the specific functions described herein. Also, the techniques could be fully implemented in one or more circuits or logic elements, which could also be considered a controller.

If implemented in software, the techniques attributed to controller 14 may be realized at least in part by a computer-readable medium comprising instructions that, when executed in a processor, performs one or more of the methods described above. The computer-readable medium may comprise a tangible computer-readable storage medium and may form part of a larger product. The computer-readable storage medium may comprise random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The computer-readable storage medium may also comprise a non-volatile storage device, such as a hard-disk, magnetic tape, a compact disk (CD), digital versatile disk (DVD), Blu-ray disk, holographic data storage media, or other non-volatile storage device. In some examples, the computer-readable storage medium is non-transitory.

Various examples have been described. These and other examples are within the scope of the following claims.

What is claimed is:

1. A system comprising:
an integrated circuit device comprising:
a plurality of functional elements arranged to span an area of the integrated circuit device and configured to provide at least one function to the integrated circuit device via at least one first interconnection of the integrated circuit device;
a plurality of test elements interspersed with the plurality of functional elements, each of the plurality of test elements being electrically isolated from the at least one first interconnection; and
a plurality of access elements, each access element of the plurality of access elements being electrically isolated from the at least one first interconnection and electrically coupled via at least one second interconnection of the integrated circuit device to at least one test element of the plurality of test elements, wherein:
each access element of the plurality of access elements is configured to relay an electrical stimulus to the at least one test element to which the access element is coupled, via the at least one second interconnection while the plurality of functional elements provides the at least one function,
the at least one test element is configured to generate a parametric output in response to the electrical stimulus via the at least one second interconnection of the integrated circuit device while the plurality of functional elements provides the at least one function,
each access element of the plurality of access elements is further configured to output the parametric output generated by the at least one test element to which the access element is coupled, and
each of the plurality of functional elements is electrically isolated from the at least one second interconnection.

2. The system of claim 1, wherein the plurality of access elements comprises a first plurality of access elements, the system further comprising a second plurality of access elements, wherein a first access element of the first plurality of access elements is configured to relay the electrical stimulus to a first test element of the plurality of test elements, the first test element being configured to generate the parametric output in response to the electrical stimulus, and wherein a second access element of the second plurality of access elements is configured to receive the parametric output generated by the first test element and output the parametric output generated by the first test element.

3. The system of claim 1, wherein the plurality of functional elements are arranged in a grid formation.

4. The system of claim 1, wherein each test element of the plurality of test elements is functionally isolated from each functional element of the plurality of functional elements, and wherein each access element of the plurality of access elements is functionally isolated from each functional element of the plurality of functional elements.

5. The system of claim 1, wherein the plurality of test elements are uniformly interspersed with the plurality of functional elements, and the plurality of access elements are uniformly interspersed with the plurality of test elements.

6. The system of claim 1, wherein the plurality of test elements and the plurality of access elements both comprise one or more golden elements, each of the one or more golden elements being a reliability device for test and calibration that is configured to operate within operating conditions that otherwise cause the plurality of test elements and the plurality of access elements, other than the one or more golden elements, to fail.

7. The system of claim 1, further comprising at least one parametric tester, the at least one parametric tester being configured to generate the electrical stimulus relayed by each access element of the plurality of access elements to the at least one test element, and receive the parametric output outputted by each access element of the plurality of access elements.

8. The system of claim 7, wherein the at least one parametric tester is further configured to store the parametric output outputted by each access element of the plurality of access elements as a measurement of voltage and/or a measurement of current.

9. The system of claim 1, wherein one or more of the plurality of functional elements, one or more of the plurality of access elements, and one or more of the plurality of test elements are daisy chained via a plurality of third interconnections.

10. A method comprising:
while a plurality of functional elements of an area of an integrated circuit device are providing at least one function to the integrated circuit device via at least one first interconnection of the integrated circuit device:
applying an electrical stimulus to at least one access element of a plurality of access elements that are interspersed with the plurality of functional elements, wherein the at least one access element is electrically coupled via at least one second interconnection of the integrated circuit device to at least one test element of a plurality of test elements that are interspersed with the plurality of functional elements, and wherein the at least one access element is configured to output a parametric output generated by the at least one test element in response to the electrical stimulus at the at least one second interconnection of the integrated circuit device; and
determining, at the at least one access element, the parametric output generated by the at least one test element in response to the electrical stimulus at the at least one second interconnection of the integrated circuit device, wherein:
each of the plurality of test elements is electrically isolated from the at least one first interconnection,
each of the plurality of access elements is electrically isolated from the at least one first interconnection, and
each of the plurality of functional elements is electrically isolated from the at least one second interconnection.

11. The method of claim 10, wherein the electrical stimulus is generated by a parametric tester of the integrated circuit device, and wherein both the at least one access element and the at least one test element are functionally isolated from each of the plurality of functional elements.

12. The method of claim 10, further comprising identifying one or more degraded functional elements of the plurality of functional elements based on the determined parametric output.

13. The method of claim 10, wherein the at least one access element comprises a first access element, and wherein determining the parametric output further comprises determining the parametric output at a second access element.

14. A system comprising:
an integrated circuit device comprising:

a plurality of means for providing at least one function to the integrated circuit device via at least one first interconnection of the integrated circuit device, wherein the plurality of means for providing the at least one function are arranged to span an area of the integrated circuit device;

a plurality of means for testing the area of the integrated circuit device while the plurality of means for providing the at least one function are providing the at least one function, wherein the plurality of means for testing are interspersed with the plurality of means for providing the at least one function and each of the plurality of means for testing is electrically isolated from the at least one first interconnection; and a plurality of means for accessing the plurality of means for testing, each of the plurality of means for accessing being electrically isolated from the at least one first interconnection and electrically coupled via at least one second interconnection of the integrated circuit device to at least one means for testing of the plurality of means for testing, wherein:

each means for accessing is configured to relay an electrical stimulus to the at least one means for testing to which the means for accessing is coupled, via the at least one second interconnection while the plurality of means for providing the at least one function are providing the at least one function, the at least one means for testing of the plurality of means for testing is configured to generate a parametric output in response to the electrical stimulus via the at least one second interconnection of the integrated circuit device while the plurality of means for providing the at least one function are providing the at least one function, each means for accessing is further configured to output the parametric output generated by the at least one means for testing to which the access element is coupled, and each of the plurality of means for providing the at least one function is electrically isolated from the at least one second connection.

15. The system of claim 14, further comprising:
means for generating the electrical stimulus;
means for receiving the parametric output; and
means for generating an output indicative of a health status of the means for providing the at least one function based on the parametric output.

16. The integrated circuit device of claim 14, further comprising means for identifying one or more degraded functional elements of the plurality of functional elements based on the parametric output.

17. The integrated circuit device of claim 14, wherein the plurality of means for accessing comprises a first plurality of means for accessing, the system further comprising a second plurality of means for accessing, wherein a first means for accessing of the first plurality of means for accessing is configured to relay the electrical stimulus to a first means for testing of the plurality of means for testing, the first means for testing being configured to generate the parametric output in response to the electrical stimulus, and wherein a second means for accessing of the second plurality of means for accessing is configured to receive the parametric output generated by the first means for testing and output the parametric output generated by the first means for testing.

* * * * *